United States Patent [19]

Wildeboer

[11] 4,412,093
[45] Oct. 25, 1983

[54] MICROCIRCUIT FLAT PACK WITH INTEGRAL SHELL

[75] Inventor: Nicolaas Wildeboer, South Dartmouth, Mass.

[73] Assignee: Isotronics, Inc., New Bedford, Mass.

[21] Appl. No.: 302,524

[22] Filed: Sep. 16, 1981

[51] Int. Cl.³ .............................................. H05K 5/06
[52] U.S. Cl. ................................. 174/52 FP; 29/827; 357/74
[58] Field of Search .................... 174/52 FP, 52 S; 357/74; 29/588, 827

[56] References Cited

U.S. PATENT DOCUMENTS 3,320,351 5/1967 Glickman ....................... 174/52 FP
3,376,376 4/1968 Smith ............................. 174/52 S X
3,484,533 12/1969 Kauffman .................... 174/52 FP X Primary Examiner—A. T. Grimley
Assistant Examiner—D. A. Tone
Attorney, Agent, or Firm—Weingarten, Schurgin, Gagnebin & Hayes

[57] ABSTRACT

A microcircuit flat package which remains hermetically sealed even under conditions of high stress. The package comprises an integral rectangular metal tubular shell having an opening in one of the broad walls, and elongated integral insulators sealed in the open ends of the tube, each insulator having an array of leads extending in sealed manner therethrough. A microcircuit is installed within the package and connected via wire bonds to the inner ends of the leads and after which a cover can be bonded onto the flat coplanar surfaces of the tubular shell surrounding the package opening to hermetically enclose the microcircuit.

7 Claims, 3 Drawing Figures

MICROCIRCUIT FLAT PACK WITH INTEGRAL SHELL

FIELD OF THE INVENTION

This invention relates to microcircuit packages, and more particularly to flat packages for containing a microcircuit in hermetically sealed condition and capable of withstanding high stress.

BACKGROUND OF THE INVENTION

A well-known packaging configuration for microcirucits is known as a flat package or flat pack, which comprises a rectangular metal box having a base and side walls with leads passing through openings in one or more of the side walls by way of glass-to-metal seals. A flat pack of known form is of layered or sandwich construction in which a glass ring is provided over a metal baseplate, with one or more lead frames installed on the glass ring and over which a second glass ring is installed with a metal frame thereover. This layered structure is thermally processed to fuse the leads of the lead frames within the glass rings and to seal the glass rings to the underlying baseplate and overlying metal frame. A metal cover plate can be bonded to the metal frame after installation of a microcircuit within the package. Such packages are widely employed in the microcircuit industry but are not suitable for conditions of high stress such as found in heavy industrial, military, and aerospace applications. Under high stress forces, the glass-to-metal seals between the metal frame or the baseplate can fail, resulting in loss of the hermetic package seal, with resultant contamination of the microcircuit contained within the package and usually failure of the circuit.

Another known metal flat package comprises an open-topped metal box of rectangular configuration and in which each lead extends through a respective opening in a side wall and is sealed therein by a glass-to-metal bead seal. The edge of the side walls of this all-metal package can be made very flat to assure good solder sealing or welding of a cover thereon to complete the package enclosure. This type of flat package operates well under most conditions, but is relatively expensive to fabricate.

Another package of known configuration is shown in U.S. Pat. No. 4,262,300, assigned to the assignee of this invention, and in which the side walls are composed of separate components which are secured together to form a continuous side wall frame and onto which is secured a one-piece continuous top frame member having a uniform upper surface to which a package lid can be bonded.

SUMMARY OF THE INVENTION

In accordance with this invention, a microcircuit flat package is provided which remains hermetically sealed even under conditions of high stress and which can be manufactured in a commercially efficient, reliable, and low-cost manner. The novel flat pack comprises an integral rectangular metal tubular shell having an opening in one of the broad walls, and elongated integral insulators sealed in the open ends of the tube, each insulator having an array of leads extending in sealed manner therethrough. After installation of a microcircuit within the package, a cover is soldered, welded, or otherwise bonded onto the coplanar flat surfaces of the integral package shell surrounding the package opening to complete the hermetic enclosure. The package can withstand high stress exerted along any axis thereof and can retain its hermeticity even under such high stress conditions.

DESCRIPTION OF THE DRAWINGS

The invention will be more fully understood from the following detailed disclosure taken in conjunction with the accompanying drawings, in which.

DETAILED DESCRIPTION OF THE INVENTION

Figure 1:
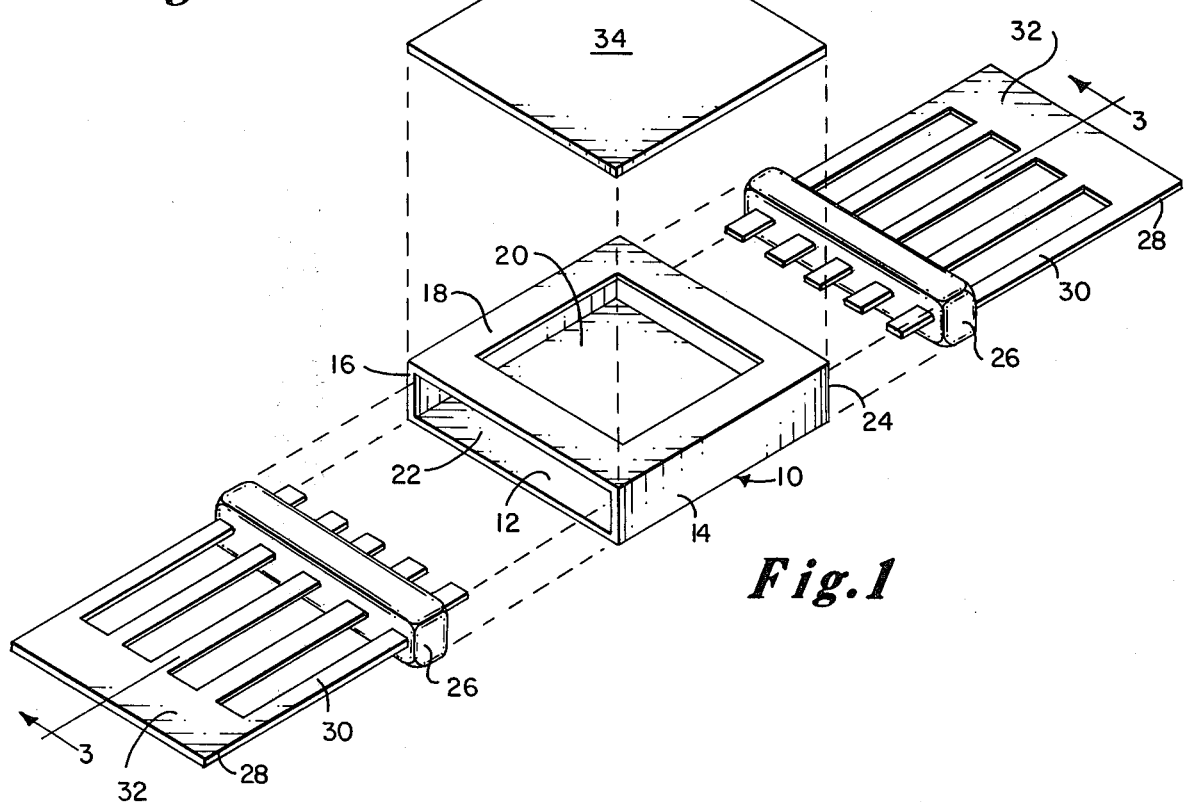
FIG. 1 is an exploded pictorial view of a microcircuit flat package in accordance with the invention.

The microcircuit flat pack embodying the invention is shown in FIG. 1 and includes a rectangular metal tubular shell 10 having a bottom wall 12, side walls 14 and 16, a peripheral top wall 18 defining a rectangular opening 20 therethrough, and openings 22 and 24 on respective ends of the tube. First and second insulators 26 are disposed within respective openings 22 and 24 and are sealed therein to the surrounding metal surfaces of the tube. Each insulator has a lead frame 28 associated therewith as a preformed subassembly, with an array of leads 30 extending in sealed engagement through the insulator. The inner ends of the leads are disposed within the package by an amount sufficient to provide bonding areas on which wire bonds extend to respective contacts of an associated microcircuit attachable within the package. The outer ends of the leads are affixed to a frame member 32 which is later severed from the leads to provide the discrete array of leads. After mounting of a microcircuit within the package and provision of electrical connections from the circuit to the respective leads, a cover 34 is soldered, welded, or otherwise bonded to the peripheral surface of the package to complete the enclosure of the circuit.

Figure 2:
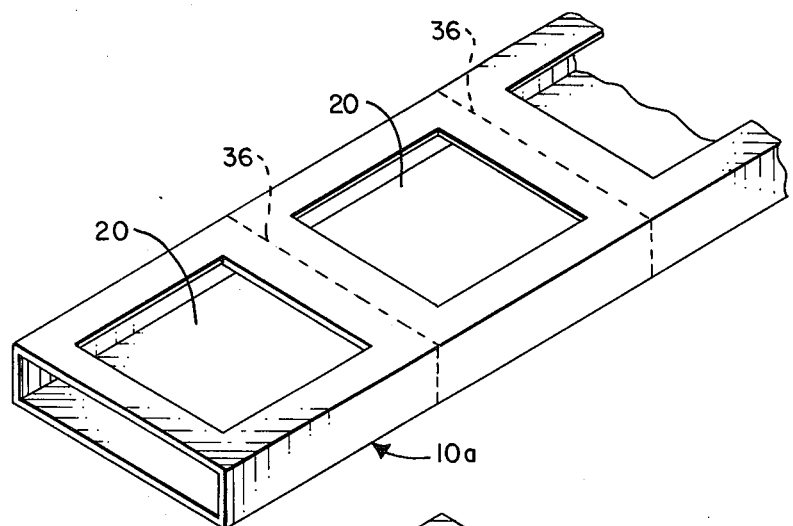
FIG. 2 is a pictorial view of the rectangular tube from which the integral flat package is formed.
Figure 3:
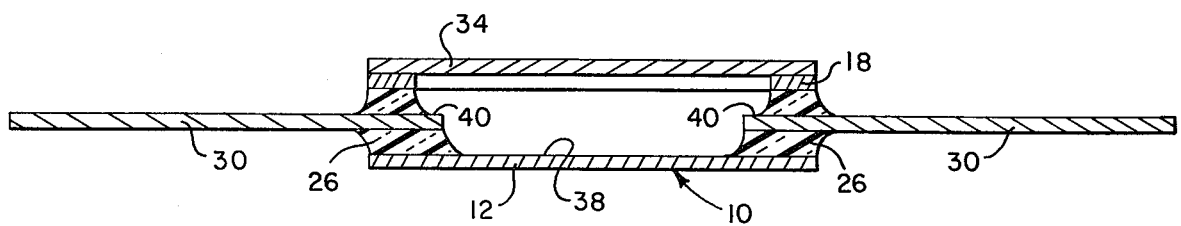
FIG. 3 is a sectional elevation view taken along lines 3—3 of FIG. 1.

The package is fabricated from a rectangular tube 34, shown in FIG. 2, which is cut to intended lengths depicted by dotted lines 36, and in which rectangular openings 20 are provided in one broad surface of the tube. Preferably, the tube 34 can be cut to an intended length and the opening 20 provided therein in one operation such as on an EDM machine. The integral shell thus formed is cleaned prior to insertion of an insulator 26 and associated lead frame 28 in respective side openings 22 or 24 of the shell. The insulator 26 and associated lead frame 28 is preformed as a subassembly, as illustrated in FIG. 1, for insertion into the respective side openings of the tubular shell. The insulator and lead frame subassembly is maintained in intended disposition within the respective side openings of the shell by appropriate fixtures while the complete package assembly is fired in an atmosphere controlled furnace to form glass-to-metal seals between the insulators 26 and the surrounding inner walls of the metal shell 10, as shown in FIG. 3. After firing of the package to form the glass-to-metal seals, the package is cleaned in accordance with well-known procedures and is plated with nickel or with gold or a combination thereof. The package is now in condition with installation of a microcircuit within the package. The microcircuit is usually affixed to the bottom inner surface 38 of the shell 10, and electrical connections are provided from the circuit to the inner ends 40 of the leads 30, such as by wire bonding.

A cover 34 is bonded to the coplanar peripheral surface 18 surrounding the rectangular opening 20 to enclose the circuit and provide a hermetically sealed package. The cover is usually flat, as illustrated, or domed and can be of metal or metalized glass or ceramic. In the case of a glass or ceramic cover, a metalized surface is provided around the periphery of the sealing surface for bonding to the peripheral surface 18 of the integral shell. Sealing of the cover to the shell is typically by brazing or welding. The novel package is readily sealed in hermetic fashion by virtue of the continuous peripheral surface 18 provided by the integral shell 10. The smooth uniform surface 18 surrounding the package opening 20 is readily sealed to the confronting surface of the cover 34 placed thereon after installation of a microcircuit within the package. The integral shell construction also minimizes the number of glass-to-metal seals employed in the overall package such that there is less tendency for breakage of a seal under conditions of high stress, as a result of which the package can remain hermetically sealed even under such conditions of high stress.

The integral shell 10 is typically fabricated of Kovar and in a variety of sizes to suit standard microcircuit dimensions and lead configurations. Typically, the shell 10 is of square or rectangular configuration having outer dimensions ranging from 0.250 inch to 0.625 inch.

It is understood that the invention is not to be limited by what has been particularly shown and described except as indicated in the appended claims.

What is claimed is:

1. Apparatus for forming a microcircuit flat package comprising:
    an integral and elongated metal tubular shell subassembly having four walls closed on themselves to define two open ends, said walls consisting of first and second broad walls which are joined by respective third and fourth side walls to form said open ends, one of said broad walls having an opening formed therein to provide a continuous and surrounding surface which is peripheral to said opening formed in said broad wall;
    an elongated integral insulator subassembly having an array of electrical leads extending through and sealed within an insulative glass body, the insulative glass body of the integral insulator subassembly being dimensioned to be received in each said open end of said tubular shell and to align the leads in substantially parallel alignment with the longitudinal axis of said tubular shell, with the peripheral surface of the insulative body in glass-to-metal non-sealing engagement with the surrounding surfaces of said first, second, third, and fourth walls of said integral shell, with each of the leads terminating at an inner end within said tubular shell and with each of the leads terminating at an outer end exteriorly of said tubular shell, said peripheral surface of the insulative body in glass-to-metal non-sealing engagement with the surrounding surfaces of said first, second, third, and fourth walls of said integral shell providing opposed, touching surfaces that can be subsequently sealed together;
    said continuous peripheral surface surrounding said opening in said one of said broad walls of said tubular shell providing a sealing surface to which a cover can be hermetically sealed.

2. The package of claim 1 including a cover member sealable to said continuous peripheral surface of the tubular shell.

3. The package of claim 1 wherein the opening in the broad wall is of rectangular configuration.

4. The microcircuit flat package of claim 1, wherein said broad walls of said integral and elongated metal tubular shell have a square geometry.

5. The microcircuit flat package of claim 1, wherein said broad walls of said integral and elongated metal tubular shell have a rectangular geometry.

6. A method for fabricating a microcircuit flat package comprising the steps of:
    cutting a tube having first and second broad walls joined by respective third and fourth side walls to form at least one tubular shell of intended length having open ends;
    forming an opening in one of said broad walls of said at least one tubular shell;
    inserting a lead frame subassembly having an array of electrical leads extending through and sealed within an elongated insulative body into each of said open ends of said at least one tubular shell, the elongated insulator body adapted to fit within respective open ends of the at least one tubular shell and to align the leads in parallel alignment with the long axis of the at least one tubular shell; and
    forming a glass-to-metal seal between the elongated insulator body and the surrounding surface of the tubular shell.

7. The method of claim 6, wherein said tube has a rectangular geometry.

* * * * *